United States Patent
Mannhart

(10) Patent No.: US 7,618,923 B2
(45) Date of Patent: Nov. 17, 2009

(54) METHOD FOR MAKING A SUPERCONDUCTOR WITH IMPROVED MICROSTRUCTURE

(76) Inventor: Jochen Dieter Mannhart, Edelweissring 46, D-86321 Koenigsbrunn (DE)

( * ) Notice: Subject to any disclaimer, the term of this patent is extended or adjusted under 35 U.S.C. 154(b) by 444 days.

(21) Appl. No.: 10/501,747

(22) PCT Filed: Jan. 29, 2002

(86) PCT No.: PCT/IB02/00343

§ 371 (c)(1),
(2), (4) Date: Dec. 14, 2004

(87) PCT Pub. No.: WO03/065467

PCT Pub. Date: Aug. 7, 2003

(65) Prior Publication Data

US 2005/0107260 A1    May 19, 2005

(51) Int. Cl.
*H01L 39/06* (2006.01)
*H01B 12/00* (2006.01)

(52) U.S. Cl. .................. 505/430; 505/452; 505/500; 505/237; 428/699; 29/599

(58) Field of Classification Search ............ 505/100, 505/236, 237, 238, 704; 428/469, 697, 472.1; 29/599; 174/125.1; 427/62
See application file for complete search history.

(56) References Cited

U.S. PATENT DOCUMENTS

| | | | | |
|---|---|---|---|---|
| 3,983,521 | A * | 9/1976 | Furuto et al. | 335/216 |
| 5,872,080 | A * | 2/1999 | Arendt et al. | 505/238 |
| 6,114,287 | A * | 9/2000 | Lee et al. | 505/473 |
| 6,226,858 | B1 * | 5/2001 | Matsumoto et al. | 29/599 |

(Continued)

FOREIGN PATENT DOCUMENTS

DE    42 37 576 A1    11/1994

(Continued)

OTHER PUBLICATIONS

Feldman et al, "Influence of Nickel substrate grain structure on YBa2Cu3O7-x supercurrent connectivity in deformation-textured coated conductors," 2000, V 77(18), pp. 2906-2908.*

(Continued)

*Primary Examiner*—Stanley Silverman
*Assistant Examiner*—Kallambella Vijayakumar
(74) *Attorney, Agent, or Firm*—Renner, Otto, Boisselle & Sklar, LLP

(57) ABSTRACT

The present invention concerns the improvement of the supercurrent carrying capabilities, i.e. the increase of critical current densities, of polycrystalline superconductor structures, especially of high-$T_c$ superconductors. By modifying the microstructure of the substrate or by appropriately influencing the buffer layers in coated conductors to obtain grains with large aspect ratios which are predominantly oriented along the direction of the current flow, grain boundaries with large areas are obtained in the polycrystalline superconducting film that can support large critical currents along the superconductor. Thereby large critical currents are obtained in the superconductor for a given spread of misorientation angles of the grains.

17 Claims, 5 Drawing Sheets

U.S. PATENT DOCUMENTS

| | | | |
|---|---|---|---|
| 6,383,989 B2 * | 5/2002 | Jia et al. | 505/236 |
| 6,455,166 B1 * | 9/2002 | Truchan et al. | 428/471 |
| 6,458,223 B1 * | 10/2002 | Hans Thieme et al. | 148/435 |
| 6,500,568 B1 * | 12/2002 | Robbins | 428/670 |
| 6,821,338 B2 * | 11/2004 | Reade et al. | 117/4 |

FOREIGN PATENT DOCUMENTS

| | | |
|---|---|---|
| EP | 0 540 416 A1 | 10/1992 |
| EP | 0 295 023 | 6/1998 |
| JP | 10-012065 * | 1/1998 |
| JP | 10-12065 | 1/1998 |
| WO | WO 99/14812 | 3/1999 |

OTHER PUBLICATIONS

International Search Report for corresponding PCT/IB02/00343, mailed Oct. 23, 2002..

Hammerl et al., "A Possible Solution of the Grain Boundary Problem for Applications of High-$T_c$ Superconductors," dated Aug. 13, 2002 ARXIV.ORG E-Print Archive,'Online! Aug. 13, 2002, XP002216017.

* cited by examiner

US 7,618,923 B2

METHOD FOR MAKING A SUPERCONDUCTOR WITH IMPROVED MICROSTRUCTURE

TECHNICAL FIELD

The present invention relates to superconductors, particularly to the current carrying capabilities of superconductors. It is a proven fact that the critical currents of many superconductors, here polycrystalline superconductors, are limited by grain boundaries formed in them. The invention overcomes this limitation of present superconductors by using alterations for improving the current transport properties of the superconductors' grain boundaries. This is done in principle by optimizing the microstructure of the substrate or of a buffer layer system onto which the superconductor is deposited, such that the polycrystalline superconductor contains large grain boundary areas.

BACKGROUND OF THE INVENTION

Based on the new class of superconductors, henceforth referred to as high-$T_c$ superconductors, which were discovered by Bednorz and Müller and disclosed in their article "Possible High-$T_c$ Superconductivity in the Ba—La—Cu—O System", Zeitschrift für Physik B, Condensed Matter, Vol. B64, 1986, pp.189-193, a variety of superconducting wires, cables and tapes have been developed for the transport of electrical current. A key parameter defining the performance and thus the economic benefit of these conductors is given by their so-called critical current density, which is the maximum current these conductors can carry as so-called supercurrents in the superconducting state divided by the cross-sectional area A of the superconductor. The critical current density is a specific property for a given superconductor, and, for the practical use of a superconductor, one aims to maximize the critical current density.

Chaudhari et al. have taught in their article "Direct Measurement of the Super-conducting Properties of Single Grain Boundaries in $YBa_2Cu_3O_{7-\delta}$", Physical Review Letters, Vol. 60, 1988, pp.1653-1655, that the limiting factor for the critical current density of polycrystalline high-$T_c$ superconductors is the electronic behavior of the boundaries formed by the crystalline grains of these materials. It was shown that the critical current densities of these grain boundaries are smaller by one to two orders of magnitude than the critical current densities of the grains abutting the grain boundaries.

Further, Dimos et al. have taught in their publication "Superconducting Transport Properties of Grain Boundaries in $YBa_2Cu_3O_{7-\delta}$ Bicrystals", Physical Review B, Vol. 41, 1990, pp. 4038-4049, that superconducting grains with a small misorientation (below typically 8° to 10°) behave as strongly coupled superconductors whereas larger misorientations (also called large-angle grain boundaries) are weakly coupled, showing Josephson junction-like properties. The teaching by Dimos et al. is the finding that the detrimental effect of the grain boundaries can be reduced by aligning the superconducting grains with respect to their crystalline main axes.

Following this proposal, wires and tapes of high-$T_c$ superconductors have been fabricated, the critical currents of which are enhanced by aligning the superconducting grains by a variety of means, such as rolling processes or ion beam assisted techniques. Although these technologies have lead to the fabrication of high-$T_c$ superconductors with current densities of the order of 100 000 A/cm² at temperatures of 4.2 K, it remains desirable to fabricate high-$T_c$ superconductors with still higher critical current densities or with processes which are less costly and faster than the known ones.

Mannhart and Tsuei have revealed in their publication "Limits of the Critical Current Density of Polycrystalline High-Temperature Superconductors Based on the Current Transport Properties of Single Grain Boundaries", Zeitschrift für Physik B, Vol. 77, 1989, pp 53-59, that the critical current density of a three-dimensional conductor can exceed by an order of magnitude the given critical current density of the grain boundaries. This approach, illustrated in FIG. 1, is based on the fact that the critical current of conductor is a function of the grain boundary critical current density as well as of the effective area A' of the grain boundaries, which may be much larger than the cross-sectional area A of the conductor. The effective grain boundary area A' may be enhanced, e.g., by adjusting the microstructure of the superconductor such that the grains have a large aspect ratio, the long sides of the grains being oriented predominantly parallel to the supercurrent flow. In their publication, Mannhart and Tsuei also revealed a procedure to calculate the critical current as a function of the grain aspect ratio. These calculations show that the critical current strongly increases with the aspect ratio of the grains, being ultimately limited only by the intragrain critical current densities.

It was pointed out by Mannhart and Tsuei that large critical current densities may be attainable by using superconducting films with aligned needle-shaped grains. Although this proposal shows the right way to fabricate tapes with large critical current, despite more than 10 years of intense R&D efforts on this problem, no way was found to fabricate such conductors.

However, in accordance with the proposal of Mannhart and Tsuei, cables based on high-$T_c$ superconductors such as $Bi_2Sr_2Ca_1Cu_2O_{8+\delta}$ or $Bi_2Sr_2Ca_2Cu_3O_{10+\delta}$ (BSCCO) so-called first generation cables have been fabricated, which use superconductors which contain platelet-like grains arranged in such a manner that huge effective grain boundary areas are obtained (see FIG. 3 for an illustration). This is described by Mannhart in "Critical Currents in High-$T_c$ Superconductors" in "Physics of High Temperature Superconductors", Proceedings of the Toshiba International School of Superconductivity, Kyoto, Japan, Jul. 15-20, 1991, Springer Series in Solid State Sciences, Vol. 106, 1992, 367-393 (1991). This method, also called powder in tube method, uses large grain boundary areas in bulk BSCCO with success. In this method, Ag-tubes are mechanically filled with BSCCO-powder. The tubes are then drawn and rolled into a final, tube- or tape-like shape and then fired for reaction and annealing. The large grain boundary areas in the bulk BSCCO-filling of the tubes originate from the platelet-like microstructure of the very anisotropic BSCCO-compounds. Unfortunately the material cost involved in the powder in tube process are so high that this technology cannot be commercially competitive.

Another method to fabricate conductors made of high-$T_c$ superconductors avoids the use of bulk materials and silver (as done in the powder in tube process), but instead enhances the grain boundary critical current densities by aligning the grains by epitaxially depositing superconducting films. It is this technology, called coated conductor technology, about which the invention is concerned. Tapes fabricated by the coated conductor technology are also called conductors of the second generation, as this process has the potential to solve the cost-problem of the first-generation conductors. The required grain alignment (texturing) is achieved, for example, by depositing the superconductor on a template that has a textured surface (an overview of coated conductors is provided by D. Larbalestier et al., "High-$T_c$ Superconducting Materials for Electric Power Applications", Nature, Vol. 414, 2001, pp 368-377 and references therein). Deposition is usually done using standard vapor phase deposition techniques such as sputtering, laser deposition, or thermal evaporation. Recently, non-vacuum techniques like sol-gel methods or dip coating have also been used for this purpose.

At present, coated conductors are fabricated by using predominantly three different processes. In all of them the conductor typically consists of a substrate, for example a metallic tape, a buffer layer system which usually is based on a series of oxide films, a layer of a high-$T_c$ superconductor such as $YBa_2Cu_3O_{7-\delta}$, and possibly several doping and capping layers. In contrast to the polycrystalline superconductor of the powder-in tube conductors, the grains in the superconductor layer of the coated conductors usually form a two-dimensional network, because the high-$T_c$ superconductor is in most cases epitaxially deposited as a polycrystalline film.

The first technique to produce coated conductors to be described here is known as the rolling assisted biaxially textured technique (RABiTS). When tapes of nickel based alloys or similar materials are rolled and suitably heat treated, the Ni-grains become textured along two of their main crystal-axes, so that grain boundaries are aligned in all directions. This makes the metallic tape a useful substrate for the fabrication of a coated conductor. On the surface of the tape a buffer layer, usually composed of $CeO_2$ and Y-stabilized $ZrO_2$ is grown. On top of this buffer layer a high-$T_c$ material, typically $YBa_2Cu_3O_{7-\delta}$, is deposited as film. These epitaxial films reproduce the microstructure of the buffer layer, which in turn has replicated the microstructure of the nickel alloy substrate. The thickness of the superconducting films is in the range of a few microns, the entire tapes being 25-50 micrometers thick. This process, known as the rolling assisted biaxially textured technique (RABiTS) is capable to produce low-angle boundaries (2°-5°), consequently, the critical current density is relatively high, reaching values above $10^5$ A/cm$^2$ at 77 K in one Tesla.

Texturing can also be induced by ion beam assisted deposition (IBAD) or deposition under a glancing angle, which is the so called inclined substrate deposition method (ISD). In these techniques the buffer layer is textured during growth. This is done in the ISD-process by using a shallow angle between the incoming beam of adatoms and the substrate surface, and in the IBAD technique by irradiating the growing film with additional ions. The critical current densities of the superconducting films, having again a typical thickness of a few micrometers, exceed $10^6$ A/cm$^2$ at 77 K and zero external magnetic field. A limiting factor for applications of these processes is their low speed, caused by the cumbersome alignment processes.

The coated conductor processes have not been able to fabricate grains with enhanced aspect ratios (see, e.g. FIG. 1$d$ of D. Larbalestier et al., "High-$T_c$ Superconducting Materials for Electric Power Applications", Nature, Vol. 414, 2001, pp 368-377), Immense efforts are devoted in Asia, the US and in Europe to improve the coated conductor processes. Despite these efforts, possible market applications are at best several years away. The reason is that the texturing of the tapes is a tedious and costly process. Due to this, the maximum length of the coated conductors produced today is in the range of several meters only, and no practical way has been found to produce larger length at competitive costs. It is clear that the commercial breakthrough of conductor conductors could be obtained if the current density of the cable could be enhanced significantly for a given grain alignment. Therefore such methods are sought with great intensity as described by P. Grant in "Currents without Borders" Nature Vol. 407, 2000, pp 139-141. If such a method was found, one could benefit for given production costs from an enhanced critical current, or, if the grain alignment was relaxed, from standard critical currents at much lower costs.

The present invention provides the solution to his problem.

SUMMARY OF THE INVENTION

A general objective of the present invention is to provide a solution for an increased use of high-$T_c$ and other superconducting materials by improving the current transport mechanisms within such materials, in particular for increasing the upper limit of the achievable supercurrent density within such materials.

A specific objective, as mentioned above, is to provide an approach by which the current carrying capabilities of superconductors, e.g. superconducting wires or tapes, can be significantly improved in a wide temperature range.

A further objective of the invention is to provide a technique for a simpler manufacturing process, resulting in cheaper mass production of polycrystalline superconductors with large critical current densities than with presently used techniques. At present, the fabrication of such superconductors requires cumbersome and costly processes to optimize the grain boundary alignment.

The novel solution taught by the invention is based on the understanding that the critical current density of coated conductors is a monotonously increasing function of the grain boundary critical current density and of the effective grain boundary area. Therefore, by enhancing the effective grain boundary area, the critical current of such a conductor will considerably exceed the product of the grain boundary critical current density and the geometrical cross-section of the conductor.

The effective grain boundary area is enhanced in two dimensional networks of superconducting grains by using grains of large aspect ratios, their long side being oriented predominantly along the direction of the current flow. In this case the supercurrent can meander along the tape, passing from one grain to the next across boundaries with large areas. It is revealed that it is possible to induce this grain structure by growth of tailored buffer layers or by using tailored substrates. It is the gist of the invention that this is achieved particularly easily by generating substrates or buffer layer systems which comprise grains with large aspect ratios.

A preferable way to fabricate superconductors containing grains with large aspect ratios is to use a modified RABiTS technology. The growth is started by using a substrate which contains grains with large aspect ratios, the long sides of which are oriented predominantly along the direction of the current flow. Such a template layer may be produced by conventional metallurgical processes, such as by pulling or rolling a tape with the standard grain aspect ratio of one. In case it is desired, but in many cases this will not even be necessary, these grains may also be oriented such that low angle grain boundaries are formed, as is done in the standard RABiTS process. Onto this layer a buffer layer and the high-$T_c$ superconductor are deposited as films, such that the shape of the grains of the template layer is replicated by the grains of the oxide layer and by the grains of the superconductors.

Coated conductors containing superconducting grains with large aspect ratios may also be obtained by altering the IBAD or ISD technologies. In these cases, nucleation of grains with large aspect ratios has to be induced by appropriately modifying the growth of the buffer layer system. Because the grain shape is controlled by the diffusion of the adatoms during film nucleation, buffer layers grains with large aspect ratios can, for example, be nucleated by using substrate surfaces with anisotropic diffusivities. Anisotropic diffusivities can be obtained, for example, by using surfaces with an appropriate orientation (for example a vicinal cut) or by modifying their microstructure, e.g., by mechanically polishing aligned grooves into the surface, or by irradiation with inclined atom or ion beams.

Due to the large aspect ratios of the grains the critical current of such tapes will be anisotropic and strongly enhanced in the direction along the long sides of the grains. For large misalignments the increase will be proportional to the average aspect ratio. This is obvious, because in this case the grain boundary critical current densities are much smaller than the intragrain critical current densities. Therefore the critical current of a grain boundary that limits the critical current of the network is determined by the product of the grain boundary critical current density and the grain boundary area. The critical current will only saturate once the critical current density approaches the intragrain critical current density, the value of which (for $YBa_2Cu_3O_{7-\delta}$ at 77 K about $5*10^6$ A/cm$^2$) by far exceeds all requirements for applications. As described, the increase of the critical currents of the large angle boundaries will be especially large. Consequently, as a function of the average grain misorientation, the critical current of such a conductor will not anymore show an exponential, but a much weaker decrease. Because the exponential decrease was the bottleneck for the realization of coated conductors (see, e.g., D. Larbalestier et al., "High-$T_c$ Superconducting Materials for Electric Power Applications", Nature, Vol. 414, 2001, pp 368-377), such a solution has been sought by many groups for many years. The increase of the critical current of the conductor will take place also in applied magnetic fields and for all temperatures below the superconducting transition temperature, significant advantages for applications.

Another advantage of the invention is that it simplifies the manufacturing process of superconductors for technical applications by allowing cheaper mass production of polycrystalline high-$T_c$ and other superconductors with large critical current densities.

To summarize, the invention concerns a method for making a long superconductor, e.g., a superconducting tape or wire, and a so produced superconductor. This long superconductor comprises at least one polycrystalline superconducting compound deposited on a substrate, preferably on a buffer layer system on said substrate, wherein at least one percolation path extends along the length of the tape or wire. This path consists of grains of the superconducting compound, whereby the majority of these grains in the path have a shape such that their projection onto the surface of the substrate, being characterized by a length $L_{par}$ parallel to the longitudinal extension of the tape and a length $L_{per}$ perpendicular thereto, has an aspect ratio $a=L_{par}/L_{per}$ exceeding 1.5 or even 2. Further, the total volume V of grains that are members of such one or more percolation paths exceeds 10% of the volume of the superconducting compound.

One of the further aspects of the invention is that at least 95% of the grains have the shape with the predetermined aspect ratio $a=L_{par}/L_{per}$.

Another aspect is that the aspect ratio $a=L_{par}/L_{per}$ of the grains in the superconductor is determined by the microstructure of the substrate, in particular by the structure of its surface, e.g., by the shape and aspect ratio of the grains forming the surface of the substrate.

A further aspect is that the aspect ratio of the grains in the superconductor is determined by the microstructure of the buffer layer system, in particular by the aspect ratio of its grains at the interface to the superconductor.

The microstructure of the substrate or the buffer layer system, respectively, may be formed by mechanical treatment for producing small grooves in its surface, e.g., by polishing the substrate's surface. It may also be controlled by atom-beam treatment. These microstructure control steps may be executed and/or repeated until an average angular misorientation of the grains of less than 15° is achieved.

Still further aspects are that the aspect ratio of the grains of the superconductor $a=L_{par}/L_{per}$ exceeds 4 and/or that the volume V of grains that are members of one or more percolation paths exceeds 25% of the volume of the superconducting compound.

Still further aspects are that the buffer layer system consists of a single layer only, or that the superconducting compound is a polycrystalline compound directly deposited on the substrate without intermediate buffer layer.

Still further aspects are that the superconducting compound is a cuprate or belongs to the $ReBa_2Cu_3O_{7-\delta}$ family, Re being a rare earth including La or Y.

Another aspect is that the superconducting compound is a multilayer arrangement whose layers have different compositions.

Still further aspects are that the grains in the superconductor are aligned such that the average misorientation angle, in particular of the a-axis of the grains, is less than 20°.

Still further aspects are that the deposition of the superconductor is performed from the vapor phase or from a solution.

A still further aspect is that the substrate is a metallic tape such as steel or Ni alloy with a thickness in the range of 20 to 100 pm, whose surface grains are appropriately aligned. Still further aspects are that the buffer layer comprises a plurality of sublayers such as $CeO_2/YsZ/CeO_2$ and/or the superconductor is of the $ReBa_2Cu_3O_{7-\delta}$ family, Re being a rare earth, including La or Y.

In the following, implementations of the invention shall be described, illustrated by the appended drawings.

NOTATION, DESCRIPTION OF EXAMPLES AND EMBODIMENTS

Because in the literature the term "grain" is used in a slightly confusing manner of coated conductors, we will clarify in the following the general usage to which we comply:

Standard RABiTS-tapes are described in the literature to consist of grains with a typical size of tens of micrometers. The growth structures out of which these grains consist are usually named "growth islands".

In IBAD- and ISD-type tapes such grains are generally lacking. Therefore in these superconductors the only grain-like structures are the growth islands which usually are referred to as grains. Their boundaries limit the critical currents in these superconductors.

Figure 1:
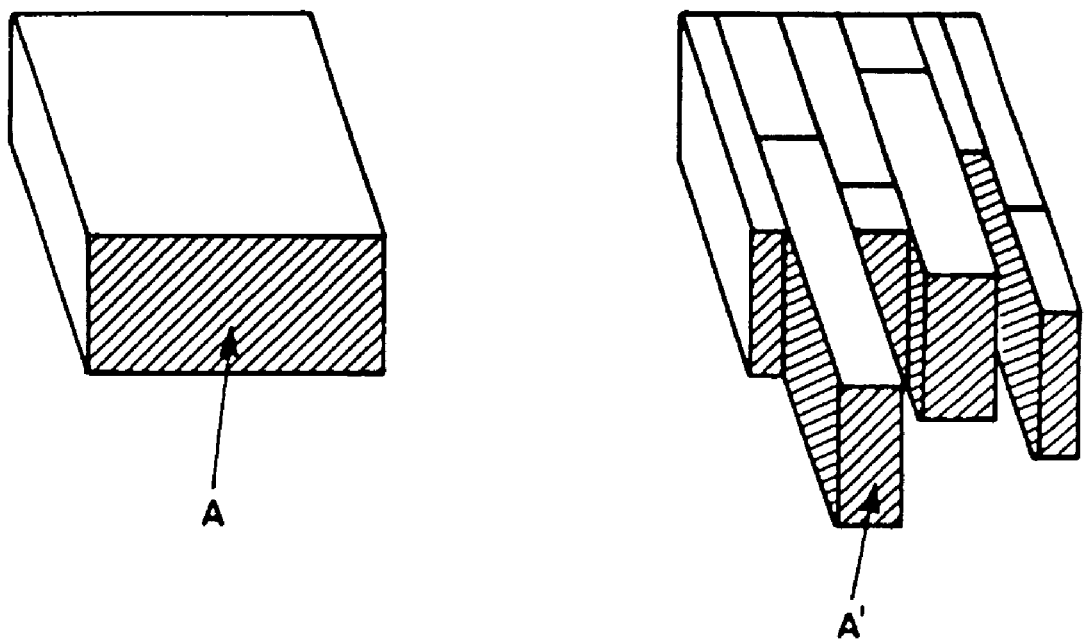
FIG. 1 shows a sketch to illustrate that in a polycrystal grain boundaries provided by grains with large aspect ratios (on the right) can have an effective area A' which considerably exceeds the cross-sectional area A of the polycrystal. The figure has been taken from Mannhart and Tsuei "Limits of the Critical Current Density of Polycrystalline High-Temperature Superconductors Based on the Current Transport Properties of Single Grain Boundaries", Zeitschrift für Physik B, Vol. 77, 1989, pp 53-59.
Figure 2:
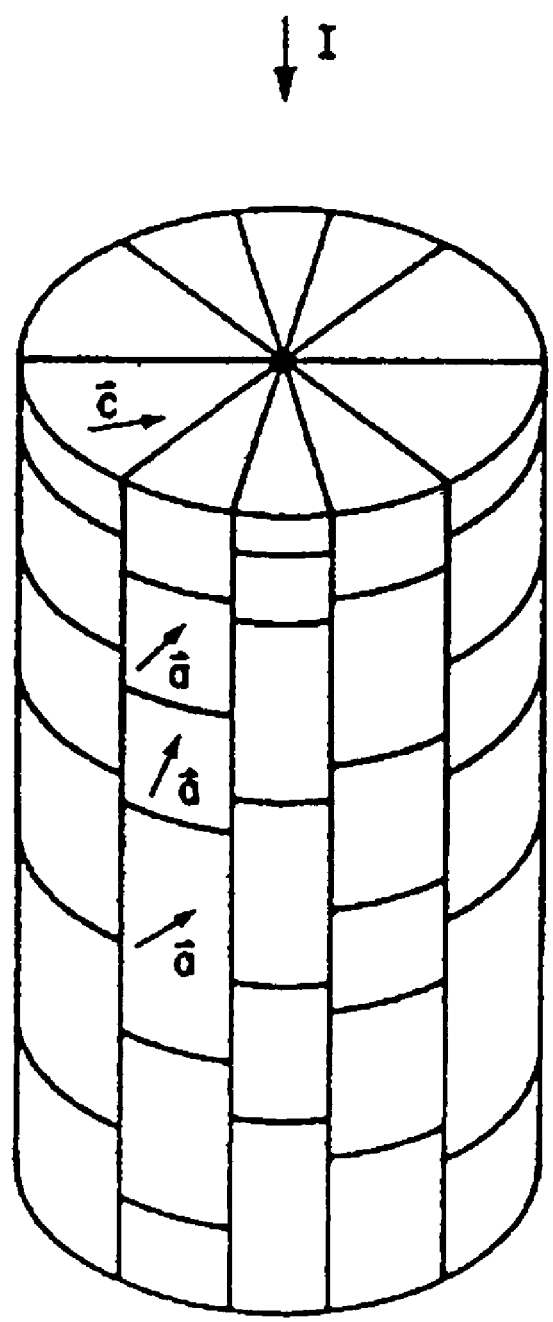
FIG. 2 shows a sketch of a polycrystalline fiber as described in Mannhart and Tsuei "Limits of the Critical Current Density of Polycrystalline High-Temperature Superconductors Based on the Current Transport Properties of Single Grain Boundaries", Zeitschrift für Physik B, Vol. 77, 1989, pp 53-59. The parameters a and c illustrate the orientation of the a- and c-axes of the grains, respectively.
Figure 3:
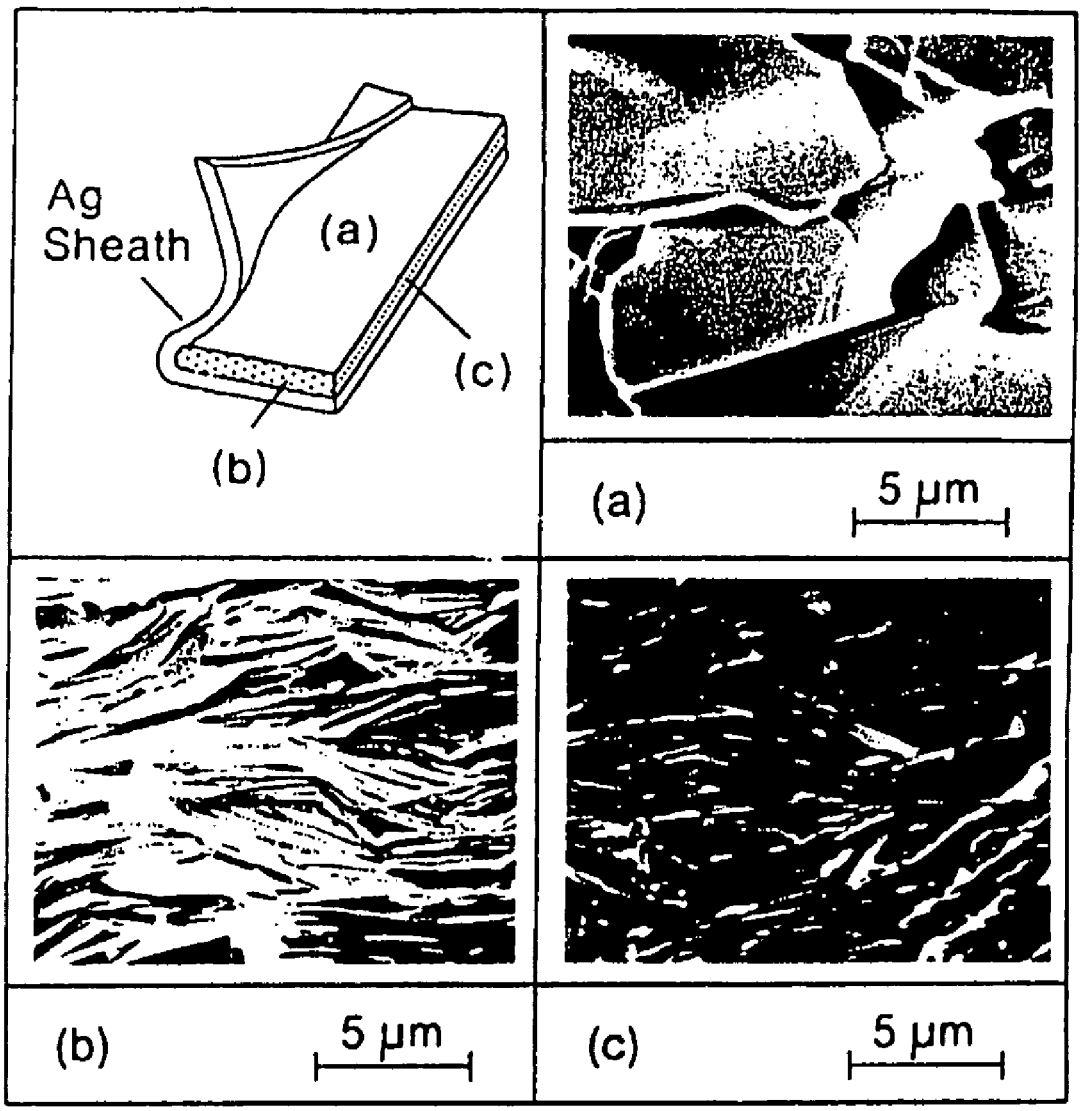
FIG. 3 shows a scanning electron microscopy image of an Ag-sheated Bi-based powder-in-tube conductor. Interconnected sheetlike BSCCO platelets are clearly visible. The figure has been taken from Y. Yamda et al. "Properties of Ag-Sheated Bi—PbSr—Ca—Cu—O Superconducting Tapes Prepared by the Intermediate Pressing Process", Jpn. J. Appl. Phys. Vol. 29, 1990, L 456-458.
Figure 4:
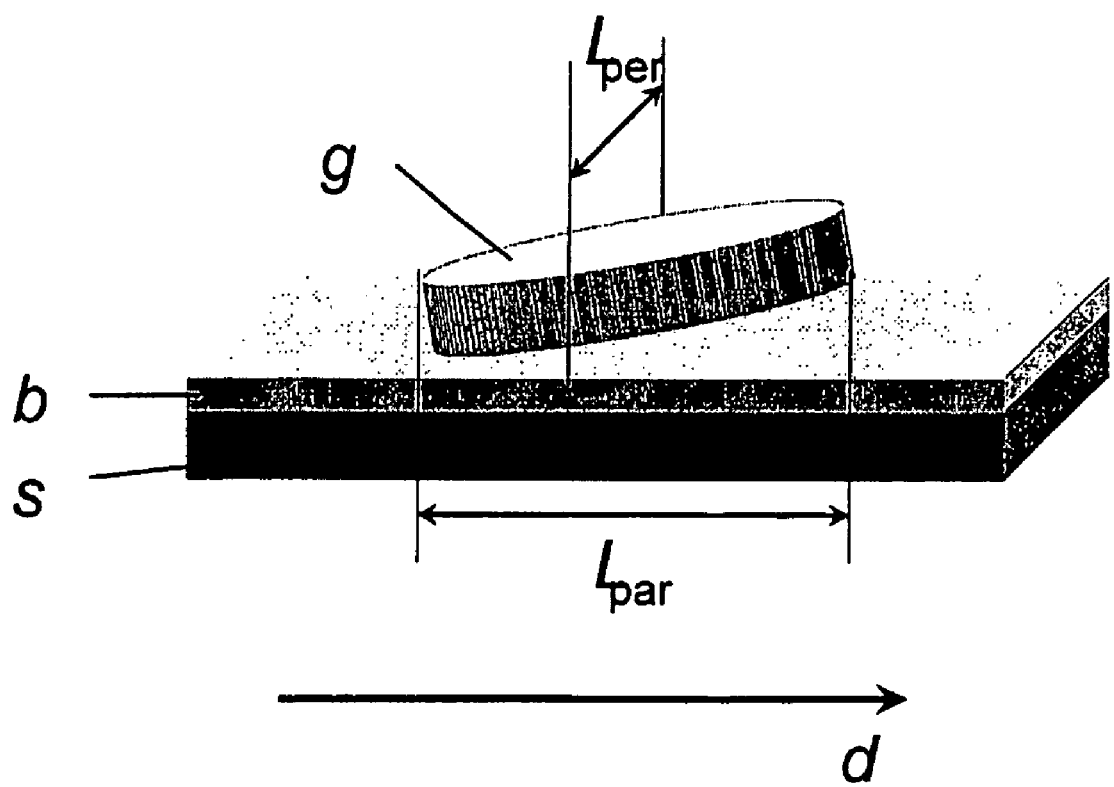
FIG. 4 is an illustration of the definition of the lengths $L_{par}$ and $L_{per}$ of a tilted superconducting grain g. For clarity the grain has been drawn as floating and to have an ellipse-like shape. The grain has been deposited on a buffer layer b and on a substrate s. The direction of the tape's long side, which is the direction of the current flow, is marked by the arrow labeled d.

The enhancement of the critical current is also achieved in case the grains are tilted with respect to the substrate surface. For this case the length of the grain in the direction of the current flow and the width are defined according to FIG. 4.

Figure 5:
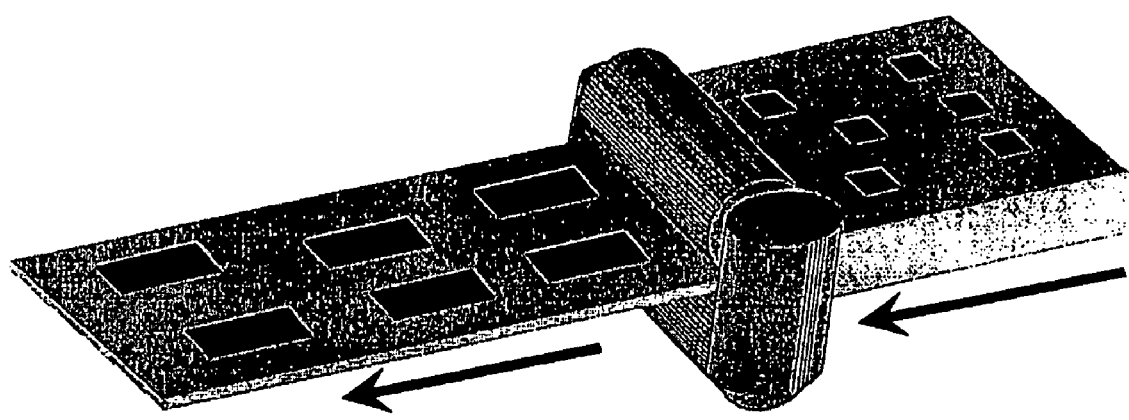
FIG. 5 shows an illustration of a rolling apparatus that can be used to increase the aspect ratio of the grains in the metal by stretching the metal in the rolling direction as indicated by the arrows. The grains are symbolized by the small dark squares and rectangles.

We provide in the following examples for the fabrication of advanced coated conductors according to the invention. In the examples, very similar materials are utilized as used in the processes employed at present. Like in the conventional IBAD or ISD processes, one may use as substrate a standard metallic tape, such as a steel or a Ni-alloy with a thickness in the range of 20 µm to 100 µm. The surface orientation of the tape has to be chosen to be appropriate for the latter growth of superconductors, e.g. of the $ReBa_2Cu_3O_{7-\delta}$ family, where Re is a rare earth or Y. Such a tape can be fabricated, for example, by rolling a standard tape with conventional grains in a die or in an arrangement of rollers as sketched in FIG. 5. If the latter arrangement is used, the increase of the grain aspect ratio will increase with the reduction of the tape thickness. Subsequently the tape is annealed at about 60-80% of its melting temperature. Repetitions of this rolling step will provide grains with even better aspect.

In another embodiment presented here as example, the surface of the tape is treated by a polishing step, such that grooves of a depth of the order of 100 nm, a length of the order of 100 µm and a density of the order of 1/µm are fabricated into the tape surface. The grooves are oriented along the direction of the current flow, that is the direction of the tape. An average misorientation of 15° is acceptable. On such tapes the buffer layer system is deposited. Such a buffer layer, which itself may consist of various sublayers, such as $CeO_2$/YsZ/$CeO_2$, is deposited on the carrier tape, to prevent chemical reactions between the high-$T_c$ film and the carrier tape material, or, e.g, the oxidation of the carrier tape during the growth of the superconductor.

As buffer-layers a variety of materials have been found useful. Besides the YSZ and $CeO_2$ compounds already mentioned, NiO, $LaTiO_3$, MgO or $SrTiO_3$ have been used successfully, to name a few examples. These buffer-layers are usually grown by standard technologies, such as sputtering, e-beam or thermal evaporation, pulsed laser deposition or metal organic chemical vapor deposition (MOCVD). But also other non-vacuum techniques may be employed, such as dip-coating, spray-coating or painting techniques.

Due to the shape of the grains at the substrate surface or due to the groove structure, which causes an anisotropic diffusivity and therefore influences the growth of the buffer layer grains such that an elongated shape develops, grains with large aspect ratios are produced in the buffer layer.

Like the buffer-layers, for the high-$T_c$ superconductors a variety of materials, or multilayers may be used, again deposited by a multitude of techniques. Standard materials are, for example, members of the so-called 123-family, comprising the $ReBa_2Cu_3O_{7-\delta}$ family, where Re is Y or a rear earth and x is a number of the order of seven. These superconductors may be covered by additional layers, e.g., by a doping layer, as described by P. Grant in "Currents without Borders" Nature Vol. 407, 2000, pp 139-141, and/or by a layer to provide an electrical shunt for quench protection, and/or by a layer to protect the whole package from environmental influences. Those skilled in the art will easily recognize many more variations of this scheme. These layers may be grown by using a variety of film growth techniques, such as such as sputtering, e-beam or thermal evaporation, pulsed laser deposition or MOCVD. But also here again, other non-vacuum techniques, like, e.g., dip-coating, spray-coating, or painting processes may be utilized.

Persons skilled in the art can apply this invention for cheaper mass production of superconducting tapes or wires, operated preferentially at 77 K or at any other temperature suitable for power applications or the design of strong magnets.

The main advantages offered by the invention, namely the enhanced current-carrying capabilities and the reduced sensitivity to magnetic fields, reduces the costly and cumbersome requirements to align the superconducting grains for wires as it is presently done for coated conductors. These properties make a superconductor according to the present invention perfectly suitable for many applications, e.g. as superconducting cables, wires or tapes, which have not been competitive and thus hardly marketable until now. With the invention, superconductors will become less expensive and thus broadly marketable and competitive for many applications.

Based on the above description and the given examples and applications, a person skilled in the art can easily vary the described invention, its values, and its materials given above, and adapt the invention to other implementations without departing from the inventive gist as defined in the appended claims.

The invention claimed is:

1. A method for making a long superconductor, e.g. a tape or wire, by depositing at least one polycrystalline superconducting compound onto a metallic substrate or onto a buffer layer system on said substrate, characterized by the following steps fabricating said metallic substrate or said buffer layer system to consist of or to contain at least on its surface a microstructure of longitudinally oriented, long grains with a high aspect ratio, $a=L_{par}/L_{per}$ exceeding 1.5, said microstructure being controlled by mechanical, atom-beam, or ion-beam treatment, treating said surface of said metallic substrate or top of said buffer layer to form grooves in a direction of current flow, and epitaxially growing said superconducting compound on said substrate or on a top layer of said buffer layer system to produce a percolation path of long superconducting grains being aligned longitudinally and exhibiting a high aspect ratio such that their projection, being characterized by a length $L_{par}$ parallel to the longitudinal extension of said superconductor and a length $L_{per}$ perpendicular thereto, has an aspect ratio $a=L_{par}/L_{per}$ exceeding 1.5, the total volume V of said long superconducting grains exceeding 10% of the volume of said superconducting compound.

2. The method according to claim 1, wherein the buffer layer system is provided on a substrate of arbitrary structure, the top layer of said buffer layer system containing or consisting of a microstructure of longitudinally aligned grains with the high aspect ratio, $a=L_{par}/L_{per}$ exceeding 1.5, and wherein the superconducting compound is grown on said top layer of said buffer layer system.

3. The method according to claim 1, wherein the grooves have a depth of about 100 nm, a length of about 100 μm and a density of about 1/μm.

4. The method according to claim 1, wherein the microstructure control steps are executed and/or repeated until an average angular misorientation of the produced long grains of the superconducting compound of less than 15° is achieved.

5. The method according to claim 1, wherein the superconducting compound is deposited from the vapor phase.

6. The method according to claim 1, wherein the deposition of the superconducting compound or is performed from a solution.

7. An at least partly superconducting object, in particular a wire or cable, comprising a superconductor fabricated according to claim 1.

8. The method according to claim 2, wherein the buffer layer system consists of a single layer only.

9. The method according to claim 1, wherein the aspect ratio a>4.

10. The method according to claim 1, wherein the total volume V>25%.

11. The method according to claim 1, wherein the superconducting compound is a polycrystalline multilayer arrangement whose layers have different compositions.

12. The method according to claim 11, wherein at least one layer of the superconducting compound is or contains a cuprate.

13. The method according to claim 11, wherein at least one superconducting compound of the layers belongs to the $ReBa_2Cu_3O_{7-\delta}$ family, Re being a rare earth including La or Y.

14. The method according to claim 1, wherein the grains of the substrate and/or the grains of the superconductor are aligned such that the average misorientation angle is below 20°.

15. The method according to claim 1, wherein the substrate is a metallic tape such as steel or a Ni alloy with a thickness in the range of 20 to 100 μm, whose surface grains are appropriately aligned.

16. The method according to claim 2, wherein the buffer layer system comprises a plurality of sublayers such as $CeO_2$/YsZ/$CeO_2$.

17. A method for making a long superconductor, e.g. a tape or wire, by depositing at least one polycrystalline superconducting compound onto a metallic substrate or onto a buffer layer system on said substrate, characterized by the following steps:

fabricating said metallic substrate or said buffer layer system to consist of or to contain at least on its surface a microstructure of longitudinally oriented, long grains with a high aspect ratio, $a=L_{par}/L_{per}$ exceeding 1.5, said microstructure being controlled by mechanical, atom-beam, or ion-beam treatment, said surface of said substrate or of the top buffer layer is treated to produce grooves, said grooves having a depth of about 100 nm, a length of about 100 μm and a density of about 1/μm, and epitaxially growing said superconducting compound on said substrate or on a top layer of said buffer layer system to produce a percolation path of long superconducting grains being aligned longitudinally and exhibiting a high aspect ratio such that their projection, being characterized by a length $L_{par}$ parallel to the longitudinal extension of said superconductor and a length $L_{per}$ perpendicular thereto, has an aspect ratio $a=L_{par}/L_{per}$ exceeding 1.5, the total volume V of said long superconducting grains exceeding 10% of the volume of said superconducting compound.

* * * * *